US 10,408,911 B2

(12) United States Patent
Kostrba et al.

(10) Patent No.: US 10,408,911 B2
(45) Date of Patent: Sep. 10, 2019

(54) NETWORK CONFIGURABLE SYSTEM FOR A POWER METER

(71) Applicant: Veris Industries, LLC, Tualatin, OR (US)

(72) Inventors: Kurt Kostrba, Tualatin, OR (US);
Gregory P. Dolim, Tigard, OR (US);
Aaron Parker, Happy Valley, OR (US);
David A. Bruno, Portland, OR (US);
Martin Cook, Tigard, OR (US)

(73) Assignee: Veris Industries, LLC, Tualatin, OR (US)

( * ) Notice: Subject to any disclaimer, the term of this patent is extended or adjusted under 35 U.S.C. 154(b) by 392 days.

(21) Appl. No.: 15/185,794

(22) Filed: Jun. 17, 2016

(65) Prior Publication Data

US 2017/0187836 A1 Jun. 29, 2017

Related U.S. Application Data

(60) Provisional application No. 62/271,426, filed on Dec. 28, 2015.

(51) Int. Cl.
| *H04L 12/26* | (2006.01) |
| *G01R 35/00* | (2006.01) |
| *H04L 12/825* | (2013.01) |
| *G01R 35/04* | (2006.01) |
| *H04L 12/24* | (2006.01) |

(52) U.S. Cl.
CPC .......... *G01R 35/005* (2013.01); *G01R 35/04* (2013.01); *H04L 43/08* (2013.01); *H04L 47/25* (2013.01); *H04L 41/0631* (2013.01); *H04L 41/22* (2013.01); *H04L 43/0823* (2013.01)

(58) Field of Classification Search
CPC .......... G01R 21/06; H04L 43/08; H04L 47/25
USPC ..................................................... 324/103 R
See application file for complete search history.

(56) References Cited

U.S. PATENT DOCUMENTS

| 1,100,171 A | 6/1914 | Brown |
| 1,455,263 A | 5/1923 | Oberfell |
| 1,569,723 A | 1/1926 | Dickinson |
| 1,800,474 A | 4/1931 | Scherer |
| 1,830,541 A | 11/1931 | Harris |
| 1,871,710 A | 8/1932 | Lenehan |
| 2,059,594 A | 11/1936 | Massa |
| 2,412,782 A | 12/1946 | Palmer |
| 2,428,613 A | 10/1947 | Boyajian |
| 2,663,190 A | 12/1953 | Ilgenfritz |
| 2,746,295 A | 5/1956 | Lubkin |
| 2,802,182 A | 8/1957 | Godshalk et al. |
| 2,852,739 A | 9/1958 | Hansen |
| 2,943,488 A | 7/1960 | Strobel et al. |
| 3,190,122 A | 6/1965 | Edwards |
| 3,243,674 A | 3/1966 | Ebert |
| 3,287,974 A | 11/1966 | Ciemochowski |
| 3,374,434 A | 3/1968 | Perry |
| 3,493,760 A | 2/1970 | Hoadley |

(Continued)

FOREIGN PATENT DOCUMENTS

| EP | 1531334 A2 | 5/2005 |
| WO | 2016176315 A1 | 11/2016 |

*Primary Examiner* — Patrick Assouad
*Assistant Examiner* — Demetrius R Pretlow
(74) *Attorney, Agent, or Firm* — Chernoff, Vilhauer, McClung & Stenzel, LLP

(57) ABSTRACT

A system for the configuration of power meters.

20 Claims, 12 Drawing Sheets

(56) References Cited

U.S. PATENT DOCUMENTS

| | | | |
|---|---|---|---|
| 3,512,045 A | 5/1970 | Tipton et al. |
| 3,584,294 A | 6/1971 | Siwko |
| 3,593,078 A | 7/1971 | Domshy et al. |
| 3,696,288 A | 10/1972 | Carman |
| 3,728,705 A | 4/1973 | Atkins |
| 3,769,548 A | 10/1973 | Pardue |
| 3,772,625 A | 11/1973 | Raupach |
| 3,861,411 A | 1/1975 | Mitchell et al. |
| 3,955,701 A | 5/1976 | Fisch |
| 4,001,647 A | 1/1977 | Klein et al. |
| 4,001,758 A | 1/1977 | Esper et al. |
| 4,030,058 A | 6/1977 | Riffe et al. |
| 4,048,605 A | 9/1977 | McCollum |
| 4,096,436 A | 6/1978 | Cook et al. |
| 4,107,519 A | 8/1978 | Bicek |
| D249,883 S | 10/1978 | Collins |
| 4,151,578 A | 4/1979 | Bell |
| 4,158,217 A | 6/1979 | Bell |
| 4,158,810 A | 6/1979 | Leskovar |
| 4,177,496 A | 12/1979 | Bell et al. |
| 4,198,595 A | 4/1980 | Milkovic |
| 4,207,604 A | 6/1980 | Bell |
| 4,215,278 A | 7/1980 | Barbier et al. |
| 4,227,419 A | 10/1980 | Park |
| 4,241,237 A | 12/1980 | Paraskevakos et al. |
| 4,249,264 A | 2/1981 | Crochet et al. |
| 4,250,449 A | 2/1981 | Shum |
| 4,253,336 A | 3/1981 | Pietzuch |
| 4,258,348 A | 3/1981 | Belfer et al. |
| 4,297,741 A | 10/1981 | Howell |
| 4,328,903 A | 5/1982 | Baars |
| 4,354,155 A | 10/1982 | Speidel et al. |
| 4,359,672 A | 11/1982 | Hart |
| 4,362,580 A | 12/1982 | Kane et al. |
| 4,363,061 A | 12/1982 | Vaerewyck et al. |
| 4,371,814 A | 2/1983 | Hannas |
| 4,373,392 A | 2/1983 | Nagamoto |
| 4,384,289 A | 5/1983 | Stillwell et al. |
| 4,386,280 A | 5/1983 | Ricaud et al. |
| 4,388,668 A | 6/1983 | Bell et al. |
| 4,393,714 A | 7/1983 | Schmidt |
| 4,398,426 A | 8/1983 | Park et al. |
| 4,408,175 A | 10/1983 | Nelson et al. |
| 4,413,193 A | 11/1983 | Crockett |
| 4,413,230 A | 11/1983 | Miller |
| 4,426,673 A | 1/1984 | Bell et al. |
| 4,432,238 A | 2/1984 | Tward |
| 4,491,790 A | 1/1985 | Miller |
| 4,492,919 A | 1/1985 | Milkovic |
| 4,495,463 A | 1/1985 | Milkovic |
| 4,506,199 A | 3/1985 | Asche |
| 4,558,310 A | 12/1985 | McAllise |
| 4,558,595 A | 12/1985 | Kompelien |
| 4,574,266 A | 3/1986 | Valentine |
| 4,605,883 A | 8/1986 | Cockroft |
| 4,621,532 A | 11/1986 | Takagi et al. |
| 4,660,407 A | 4/1987 | Takami et al. |
| 4,672,555 A * | 6/1987 | Hart ............... G01R 19/25 |
| | | 324/142 |
| 4,709,339 A | 11/1987 | Fernandes |
| 4,739,229 A | 4/1988 | Heiler, Jr. |
| 4,746,809 A | 5/1988 | Coleman et al. |
| 4,754,365 A | 6/1988 | Kazahaya |
| 4,757,416 A | 7/1988 | Wilkerson |
| 4,758,774 A | 7/1988 | Crawford et al. |
| 4,758,962 A | 7/1988 | Fernandes |
| 4,783,748 A | 11/1988 | Swarztrauber et al. |
| 4,794,327 A | 12/1988 | Fernandes |
| 4,808,910 A | 2/1989 | Kessi |
| D301,331 S | 5/1989 | Rhodin |
| 4,851,803 A | 7/1989 | Hahn |
| 4,855,671 A | 8/1989 | Fernandes |
| 4,874,904 A | 10/1989 | DeSanti |
| 4,890,318 A | 12/1989 | Crane et al. |
| 4,926,105 A | 5/1990 | Mischenko |
| 4,939,451 A | 7/1990 | Baran et al. |
| 4,944,187 A | 7/1990 | Frick et al. |
| 4,956,588 A | 9/1990 | Ming |
| 4,970,476 A | 11/1990 | Kitagawa |
| 4,972,167 A | 11/1990 | Fujioka |
| 4,992,709 A | 2/1991 | Griffin |
| 4,999,575 A | 3/1991 | Germer |
| 5,003,278 A | 3/1991 | May |
| 5,006,846 A | 4/1991 | Granville |
| 5,014,908 A | 5/1991 | Cox |
| 5,039,970 A | 8/1991 | Cox |
| 5,051,601 A | 9/1991 | Atobe et al. |
| 5,051,720 A * | 9/1991 | Kittirutsunetorn ... G06F 1/3209 |
| | | 340/12.33 |
| 5,066,904 A | 11/1991 | Bullock |
| 5,079,510 A | 1/1992 | Komatsu et al. |
| D323,815 S | 2/1992 | Bouteiller |
| 5,099,193 A | 3/1992 | Moseley et al. |
| 5,122,735 A | 6/1992 | Porter et al. |
| 5,148,348 A | 9/1992 | White |
| 5,181,026 A | 1/1993 | Granville |
| 5,196,784 A | 3/1993 | Estes, Jr. |
| D335,488 S | 5/1993 | Suzuki et al. |
| 5,223,790 A | 6/1993 | Baran et al. |
| 5,267,122 A | 11/1993 | Glover et al. |
| 5,296,819 A | 3/1994 | Kuroiwa et al. |
| 5,311,138 A | 5/1994 | Ott et al. |
| 5,317,274 A | 5/1994 | Nakagawa et al. |
| 5,323,256 A | 6/1994 | Banks |
| 5,337,206 A | 8/1994 | Kadah |
| 5,365,462 A | 11/1994 | McBean |
| D354,945 S | 1/1995 | Dellavecchia et al. |
| 5,384,712 A | 1/1995 | Oravetz et al. |
| 5,385,060 A | 1/1995 | Wang |
| 5,391,983 A | 2/1995 | Lusignan et al. |
| 5,397,970 A | 3/1995 | Rowlette et al. |
| 5,410,920 A | 5/1995 | Westwick |
| 5,426,360 A | 6/1995 | Maraio et al. |
| 5,430,438 A | 7/1995 | Joos et al. |
| 5,444,183 A | 8/1995 | Gehrs et al. |
| 5,450,765 A | 9/1995 | Stover |
| 5,467,012 A | 11/1995 | Nystrom |
| 5,471,359 A | 11/1995 | Simpson et al. |
| 5,473,234 A | 12/1995 | Richardson |
| 5,548,209 A | 8/1996 | Lusignan et al. |
| 5,563,506 A | 10/1996 | Fielden et al. |
| 5,572,073 A | 11/1996 | Burgess et al. |
| 5,578,927 A | 11/1996 | Perelle |
| 5,592,989 A | 1/1997 | Lynn et al. |
| 5,596,652 A | 1/1997 | Piatek et al. |
| 5,604,315 A | 2/1997 | Briefer et al. |
| 5,612,499 A | 3/1997 | Andrew et al. |
| 5,677,476 A | 10/1997 | McCarthy et al. |
| 5,705,989 A | 1/1998 | Cota et al. |
| 5,712,558 A | 1/1998 | Saint-Cyr |
| 5,753,983 A | 5/1998 | Dickie et al. |
| 5,784,249 A | 7/1998 | Pouliot |
| 5,808,846 A | 9/1998 | Holce et al. |
| 5,844,138 A | 12/1998 | Cota |
| 5,861,683 A | 1/1999 | Engel et al. |
| 5,880,677 A | 3/1999 | Lestician |
| 5,880,918 A | 3/1999 | Horbelt et al. |
| 5,905,439 A | 5/1999 | McIntyre |
| 5,909,087 A | 6/1999 | Bryde et al. |
| 5,920,190 A | 7/1999 | Peterson et al. |
| 5,920,191 A | 7/1999 | Maniero et al. |
| 5,922,939 A | 7/1999 | Cota |
| 5,994,892 A | 11/1999 | Turino et al. |
| 5,995,911 A | 11/1999 | Hart |
| D419,964 S | 2/2000 | Holce et al. |
| 6,020,702 A | 2/2000 | Farr |
| 6,029,524 A | 2/2000 | Klauder et al. |
| 6,044,430 A | 3/2000 | MacDonald |
| 6,046,550 A | 4/2000 | Ference et al. |
| 6,064,192 A | 5/2000 | Redmyer |
| 6,091,023 A | 7/2000 | O'Donnell |
| 6,122,972 A | 9/2000 | Crider |
| 6,124,791 A | 9/2000 | Wolf |
| D431,534 S | 10/2000 | Holce et al. |

(56) References Cited

U.S. PATENT DOCUMENTS

| | | |
|---|---|---|
| 6,133,709 A | 10/2000 | Puchianu |
| 6,133,723 A | 10/2000 | Feight |
| 6,137,418 A | 10/2000 | Zuercher et al. |
| 6,146,109 A | 11/2000 | Davis et al. |
| 6,236,949 B1 | 5/2001 | Hart |
| 6,269,317 B1 | 7/2001 | Schachner et al. |
| 6,308,140 B1 | 10/2001 | Dowling et al. |
| 6,330,516 B1 | 12/2001 | Kammeter |
| 6,331,821 B1 | 12/2001 | Holce et al. |
| 6,344,951 B1 | 2/2002 | Sato et al. |
| 6,351,206 B1 | 2/2002 | Schweiger et al. |
| 6,373,238 B2 | 4/2002 | Lewis et al. |
| 6,377,430 B2 | 4/2002 | Holce et al. |
| 6,380,696 B1 | 4/2002 | Sembhi et al. |
| 6,384,946 B1 | 5/2002 | Pitsch et al. |
| 6,404,166 B1 | 6/2002 | Puchianu |
| 6,414,241 B1 | 7/2002 | Carter |
| D466,078 S | 11/2002 | Bowman |
| 6,496,378 B2 | 12/2002 | Holce et al. |
| 6,504,357 B1 | 1/2003 | Hemminger et al. |
| 6,504,695 B1 * | 1/2003 | Holce ............... H02H 3/08 361/753 |
| 6,549,859 B1 | 4/2003 | Ward |
| 6,591,482 B1 | 7/2003 | Fleege et al. |
| D478,313 S | 8/2003 | Bowman |
| 6,615,147 B1 | 9/2003 | Jonker et al. |
| 6,636,028 B2 | 10/2003 | Lavoie et al. |
| 6,657,424 B1 | 12/2003 | Voisine et al. |
| 6,737,854 B2 | 5/2004 | Bruno et al. |
| 6,756,776 B2 | 6/2004 | Perkinson et al. |
| 6,774,803 B1 | 8/2004 | Tiffin |
| 6,809,509 B2 | 10/2004 | Bruno et al. |
| 6,815,942 B2 | 11/2004 | Randall et al. |
| 6,825,771 B2 | 11/2004 | Bruno et al. |
| 6,856,515 B2 | 2/2005 | Holce et al. |
| 6,861,683 B2 | 3/2005 | Rissing et al. |
| 6,871,827 B2 | 3/2005 | Petak et al. |
| 6,888,712 B2 | 5/2005 | Holce et al. |
| 6,889,271 B1 | 5/2005 | Germer et al. |
| 6,937,003 B2 | 8/2005 | Bowman et al. |
| 6,950,292 B2 | 9/2005 | Holce et al. |
| 6,988,043 B1 | 1/2006 | Randall |
| 7,006,934 B2 | 2/2006 | Jonker et al. |
| 7,053,497 B2 | 5/2006 | Sodemann et al. |
| 7,157,899 B2 | 1/2007 | Bruno |
| 7,161,345 B2 | 1/2007 | Bruno |
| 7,193,428 B1 | 3/2007 | Baron et al. |
| 7,212,930 B2 | 5/2007 | Bruno |
| 7,221,145 B2 | 5/2007 | Bowman et al. |
| 7,230,414 B2 | 6/2007 | Bruno |
| 7,239,810 B2 | 7/2007 | Seely et al. |
| 7,274,187 B2 | 9/2007 | Loy |
| 7,282,889 B2 | 10/2007 | Freed et al. |
| 7,310,049 B2 | 12/2007 | Bowman |
| 7,312,686 B2 | 12/2007 | Bruno |
| 7,312,964 B2 | 12/2007 | Tchernobrivets |
| 7,330,022 B2 | 2/2008 | Bowman et al. |
| 7,333,345 B2 | 2/2008 | Holce et al. |
| 7,352,287 B2 | 4/2008 | Rupert |
| 7,359,809 B2 | 4/2008 | Bruno |
| 7,447,603 B2 | 11/2008 | Bruno |
| 7,453,267 B2 | 11/2008 | Westbrock, Jr. et al. |
| 7,474,088 B2 | 1/2009 | Bowman et al. |
| 7,652,871 B2 | 1/2010 | Caggiano et al. |
| 8,085,055 B2 | 12/2011 | Rupert |
| 8,193,803 B2 | 6/2012 | Bose et al. |
| 8,212,548 B2 | 7/2012 | Parker et al. |
| 8,212,549 B2 | 7/2012 | McNulty et al. |
| 8,294,453 B2 | 10/2012 | Bowman |
| 8,405,383 B2 | 3/2013 | Agrawal et al. |
| 8,421,443 B2 | 4/2013 | Bitsch et al. |
| 8,610,438 B1 | 12/2013 | Sykora et al. |
| 8,612,792 B2 | 12/2013 | Fu et al. |
| 8,837,118 B2 | 9/2014 | McGrail |
| 8,878,475 B2 | 11/2014 | Bonvin et al. |
| 8,964,360 B2 | 2/2015 | Trout |
| 8,988,062 B2 | 3/2015 | Sykora et al. |
| 9,146,264 B2 | 9/2015 | Cook |
| 9,329,659 B2 | 5/2016 | Cook |
| 9,395,344 B2 | 7/2016 | Sheley |
| 9,424,975 B2 | 8/2016 | Cook et al. |
| 9,577,443 B2 | 2/2017 | Gach et al. |
| 9,588,148 B2 | 3/2017 | Cook et al. |
| 9,607,749 B2 | 3/2017 | Cook et al. |
| 2001/0040446 A1 | 11/2001 | Lapinksi |
| 2004/0227503 A1 | 11/2004 | Bowman |
| 2005/0240362 A1 | 10/2005 | Randall |
| 2006/0085144 A1 | 4/2006 | Slota et al. |
| 2006/0103548 A1 | 5/2006 | Borkowski et al. |
| 2006/0129339 A1 * | 6/2006 | Bruno ............... G01R 22/10 702/60 |
| 2006/0164096 A1 | 7/2006 | Kwon |
| 2006/0181242 A1 | 8/2006 | Freed |
| 2006/0238932 A1 | 10/2006 | Westbrock |
| 2007/0153438 A1 | 7/2007 | Caggiano et al. |
| 2008/0303511 A1 | 12/2008 | Gmo |
| 2009/0065247 A1 * | 3/2009 | Shelton ............. H05K 5/0013 174/520 |
| 2009/0115400 A1 | 5/2009 | Hunter |
| 2009/0115620 A1 | 5/2009 | Hunter |
| 2009/0295370 A1 | 6/2009 | Parker |
| 2010/0031076 A1 * | 2/2010 | Wan ............... G06F 11/3006 713/340 |
| 2010/0117626 A1 | 5/2010 | Wertz et al. |
| 2010/0176960 A1 | 7/2010 | Bitsch |
| 2010/0207604 A1 | 8/2010 | Bitsch |
| 2010/0235122 A1 | 9/2010 | McCrea |
| 2010/0308792 A1 | 12/2010 | Rupert |
| 2011/0098985 A1 | 4/2011 | Lawson |
| 2011/0181124 A1 | 7/2011 | Uesaka |
| 2012/0112681 A1 | 5/2012 | Bonvin |
| 2012/0221278 A1 | 8/2012 | Cook |
| 2012/0235667 A1 | 9/2012 | Agrawal et al. |
| 2012/0310557 A1 * | 12/2012 | Bowman ............. G01R 35/04 702/61 |
| 2013/0024714 A1 | 1/2013 | Fu et al. |
| 2013/0027818 A1 | 1/2013 | McGrail |
| 2013/0124122 A1 * | 5/2013 | Cook ................ H02S 50/10 702/64 |
| 2013/0144545 A1 | 6/2013 | Fu et al. |
| 2013/0205022 A1 * | 8/2013 | Kagan ............... H04L 67/06 709/224 |
| 2013/0231793 A1 * | 9/2013 | Elliott .............. G05B 15/02 700/292 |
| 2013/0294014 A1 | 11/2013 | Irons |
| 2014/0239964 A1 | 8/2014 | Gach et al. |
| 2015/0028848 A1 | 1/2015 | Lynch et al. |
| 2015/0293549 A1 | 10/2015 | Lal et al. |
| 2016/0366010 A1 * | 12/2016 | Hamber ............ H04L 41/0866 |

\* cited by examiner

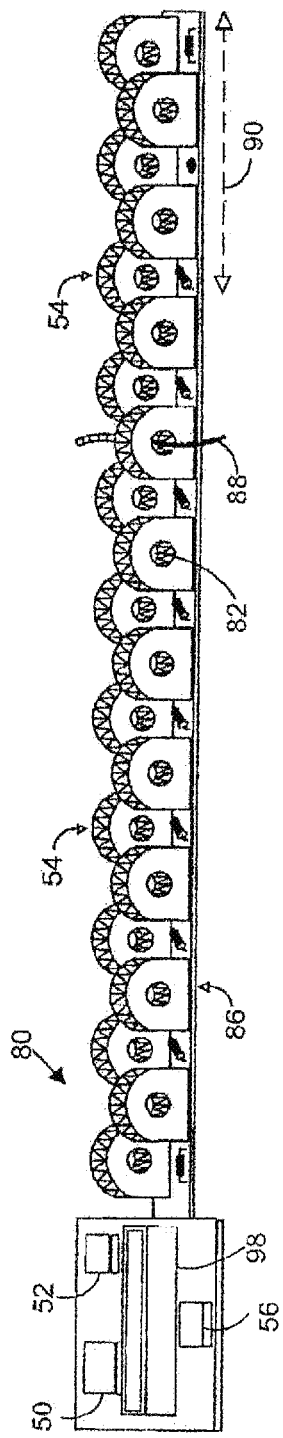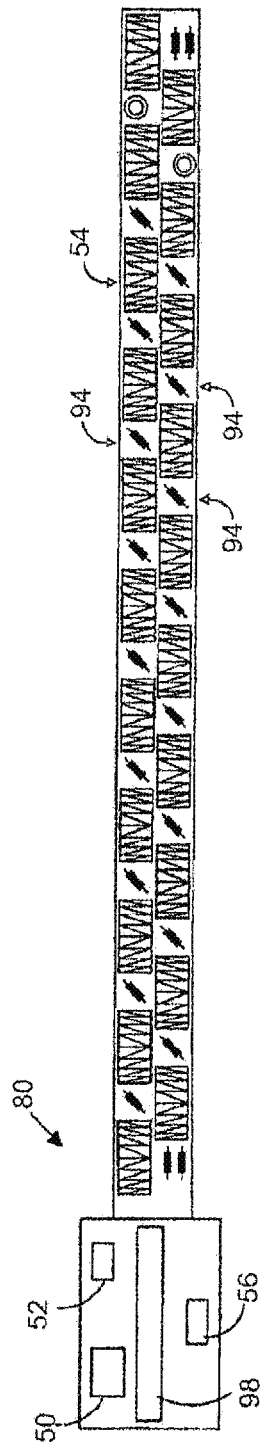
FIG. 2
FIG. 3

NETWORK CONFIGURABLE SYSTEM FOR A POWER METER

CROSS-REFERENCE TO RELATED APPLICATIONS

This application claims the benefit of U.S. Provisional App. No. 62/271,426, filed Dec. 28, 2015.

BACKGROUND OF THE INVENTION

The present invention relates to a calibration system for a power meter.

The total power consumption of a building or other facility is monitored by the electric utility with a power meter located between the utility's distribution transformer and the facility's power distribution panel. However, in many instances it is desirable to sub-meter or attribute the facility's power usage and cost to different occupancies, buildings, departments, or cost centers within the facility or to monitor the power consumption of individual loads or groups of loads, such as motors, lighting, heating units, cooling units, machinery, etc. These single phase or multi-phase electrical loads are typically connected to one or more of the branch circuits that extend from the facility's power distribution panel. While a power meter may be installed at any location between a load and the distribution panel, it is often advantageous to install a power meter capable of monitoring a plurality of circuits proximate the power distribution panel to provide centralized monitoring of the various loads powered from the panel.

Digital branch current monitors may incorporate data processing systems that can monitor a plurality of circuits and determine a number of parameters related to electricity consumption by the individual branch circuits or groups of circuits. A branch current monitor for measuring electricity consumption by respective branch circuits comprises a plurality of voltage and current transducers that are periodically read by the monitor's data processing unit which, in a typical branch current monitor, comprises one or more microprocessors or digital signal processors (DSP). For example, a branch current monitor from Veris Industries, Inc. enables up to ninety circuits to be monitored with a single meter and utilizes the MODBUS® RTU network communication interface to enable remote monitoring as part of a building or facility management system. The data processing unit periodically reads and stores the outputs of the transducers quantifying the magnitudes of current and voltage samples and, using that data, calculates the current, voltage, power, and other electrical parameters, such as active power, apparent power and reactive power that quantify the distribution and consumption of electricity. The calculated parameters are typically output to a display for immediate viewing or transmitted from the meter's communication interface to another data processing system, such as a building management computer for remote display or further processing, for example formulating instructions to the facility's automated equipment.

The voltage transducers of digital branch current monitors commonly comprise a voltage divider network that is connected to a conductor in which the voltage will be measured. The power distribution panel provides a convenient location for connecting the voltage transducers because typically each phase of the electricity is delivered to the power distribution panel on a separate bus bar and the voltage and phase is the same for all loads attached to the respective bus bar. Interconnection of a voltage transducer and the facility's wiring is facilitated by wiring connections in the power distribution panel, however, the voltage transducer(s) can be connected anywhere in the wiring that connects the supply and a load, including at the load's terminals.

The current transducers of digital power meters typically comprise current transformers that encircle each of the power cables that connect each branch circuit to the bus bar(s) of the distribution panel. Bowman et al., U.S. Pat. No. 6,937,003 B2, discloses a branch current monitoring system that includes a plurality of current transformers mounted on a common support facilitating installation of a branch current monitor in a power distribution panel. Installation of current transformers in electrical distribution panels is simplified by including a plurality of current transformers on a single supporting strip which can be mounted adjacent to the lines of circuit breakers in the panel. The aforementioned branch current monitor from Veris Industries, Inc. is commonly used to monitor up to four strips of current sensors; each comprising 21 current transformers on a common support. In addition, the branch current monitor provides for eight auxiliary current transformer inputs for sensing the current flow in two 3-phase mains with two neutrals and six voltage connections enabling voltage sensing in six bus bars of two 3-phase mains.

While such power metering devices tend to be effectively calibrated to provide accurate results upon initial installation, over time they tend to drift and age, thereby reducing the accuracy of their results.

What is desired, therefore, is a power metering system that may be effectively recalibrated, if desired.

BRIEF DESCRIPTION OF THE DRAWINGS

FIG. 2 is a perspective view of a current transformer strip for a branch current monitor.

FIG. 3 is a top view of the current transformer strip of FIG. 2.

DETAILED DESCRIPTION OF PREFERRED EMBODIMENTS

Figure 1:
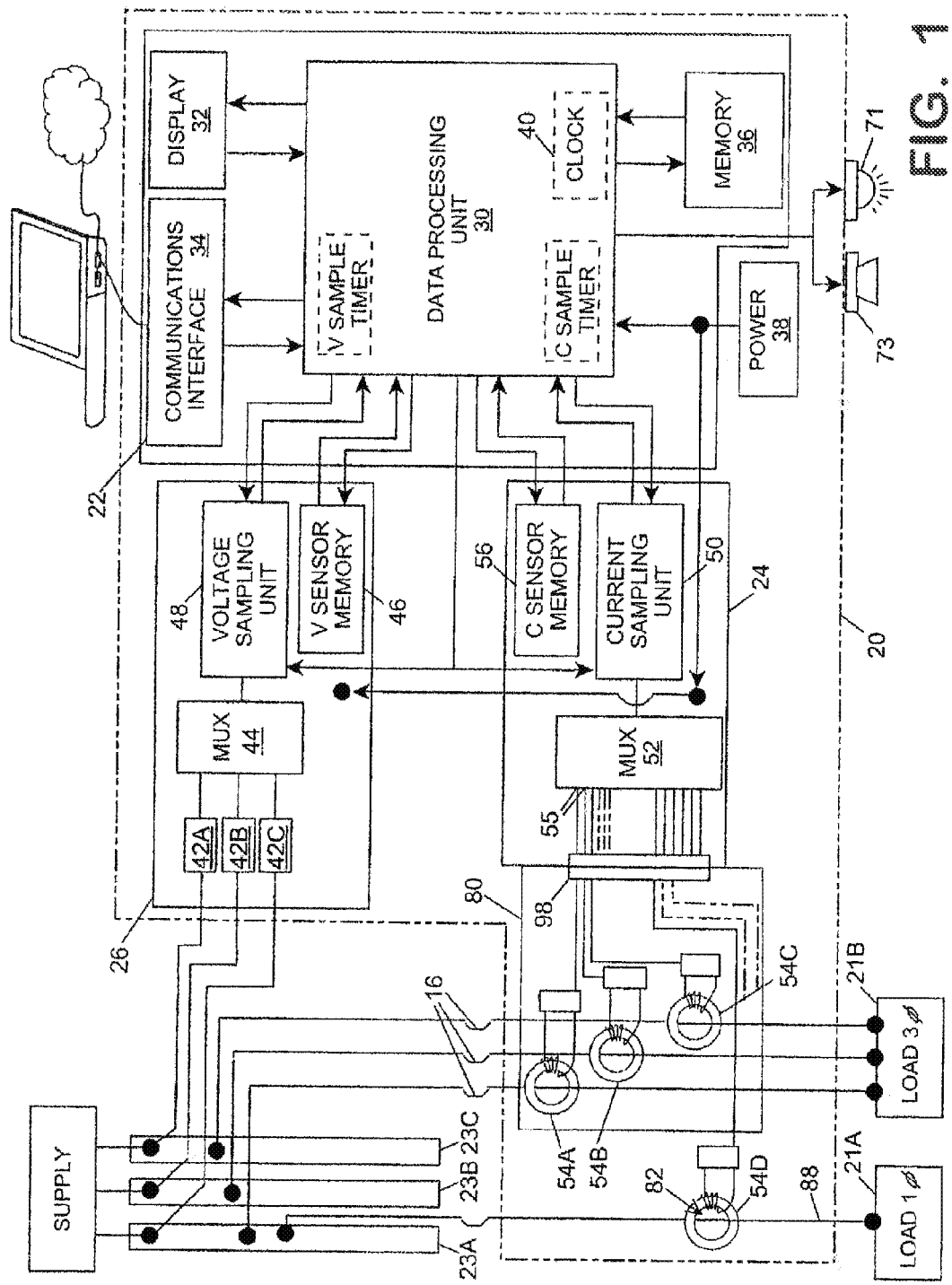
FIG. 1 is a block diagram of an exemplary branch current monitor.

Referring in detail to the drawings where similar parts are identified by like reference numerals, and, more particularly to FIG. 1, a branch current monitor 20 arranged to monitor the voltage and current in a plurality of branch circuits comprises, generally, a data processing module 22, a current module 24 and a voltage module 26. The branch current monitor 20 is preferably housed in a housing and/or the data processing module 22 is preferably housed in a housing and/or the current module 24 is preferably housed in a housing and/or the voltage module is preferably housed in a housing. In some embodiments, the branch current monitor and/or the data processing module and/or the current module and/or the voltage module includes one or more connectors suitable to detachably connect a separate power meter to sense electrical properties of the branch current monitor and/or the data processing module and/or the current module and/or the voltage module. The data processing module 22 comprises a data processing unit 30 which, typically, comprises at least one microprocessor or digital signal processor (DSP). The data processing unit 30 reads and stores data received periodically from the voltage module and the current module, and uses that data to calculate the current, voltage, power and other electrical parameters that are the meter's output. The resulting electrical parameters may be output to a display 32 for viewing at the meter or output to a communications interface 34 for transmission to another data processing system, such as a building management computer, for remote display or use in automating or managing facility functions. The data processing module may also include a memory 36 in which the programming instructions for the data processing unit and the data manipulated by the data processing unit may be stored. In addition, the branch current monitor typically includes a power supply 38 to provide power to the data processing unit and to the voltage and current modules.

The voltage module 26 includes one or more voltage transducers 42 each typically comprising a resistor network, a voltage sampling unit 48 to sample the output of the voltage transducers and convert the analog measurements to digital data suitable for use by the data processing unit and a multiplexer 44 that periodically connects the voltage sampling unit to selected ones of the voltage transducers enabling periodic sampling of the magnitude of the voltage at each of the voltage transducers. Typically, each phase of the electricity supplied to a distribution panel is connected to a bus bar 23 to which are connected the circuit breakers 16 that provide a conductive interconnection to each of the respective loads, by way of examples, a single-phase load 21A and a three-phase load 21B. Since the voltage and phase supplied to all commonly connected loads is the same, a meter for measuring three-phase power typically includes three voltage transducers 42A, 42B, 42C each connected to a respective bus bar 23A, 23B, 23C. A clock 40, which may be included in the data processing unit, provides periodic timing signals to trigger sampling of the outputs of the voltage transducers by the voltage sampling unit. The voltage module may also include a voltage sensor memory 46 in which voltage sensor characterization data, including relevant specifications and error correction data for the voltage transducers are stored. If a portion of the voltage module requires replacement, a new voltage module comprising a voltage sensor memory containing sensor characterization data for the transducers of the new module can be connected to the data processing unit. The data processing unit reads the data contained in the voltage sensor memory and applies the sensor characterization data when calculating the voltage from the transducer data output by the replacement voltage module.

The current module 24 typically comprises a current sampling unit 50, a multiplexer 52 and a plurality of current transducers 54 communicatively connected to respective sensor positions 55 of the current module. The multiplexer 52 sequentially connects the sampling unit to the respective sensor positions enabling the sampling unit to periodically sample the output of each of the current transducers 54. The current sampling unit comprises an analog-to-digital converter to convert the analog sample at the output of a current transducer selected by the multiplexer, to a digital signal for acquisition by the data processing unit. The clock 40 also provides the periodic timing signal that triggers sampling of the current transducer outputs by the current sampling unit. The current module may also include a current sensor memory 56 in which are stored characterization data for the current transducers comprising the module. The characterization data may include transducer identities; relevant specifications, such as turns ratio; and error correction factors, for examples equations or tables enabling the phase and ratio errors to be related to a current permitting correction for magnetization induced errors. The characterization data may also include the type of transducers, the number of transducers, the arrangement of transducers and the order of the transducers' attachment to the respective sensor positions of the current module. At start up, the data processing unit queries the current sensor memory to obtain characterization data including error correction factors and relevant specifications that are used by the data processing unit in determining the monitor's output.

Figure 4:
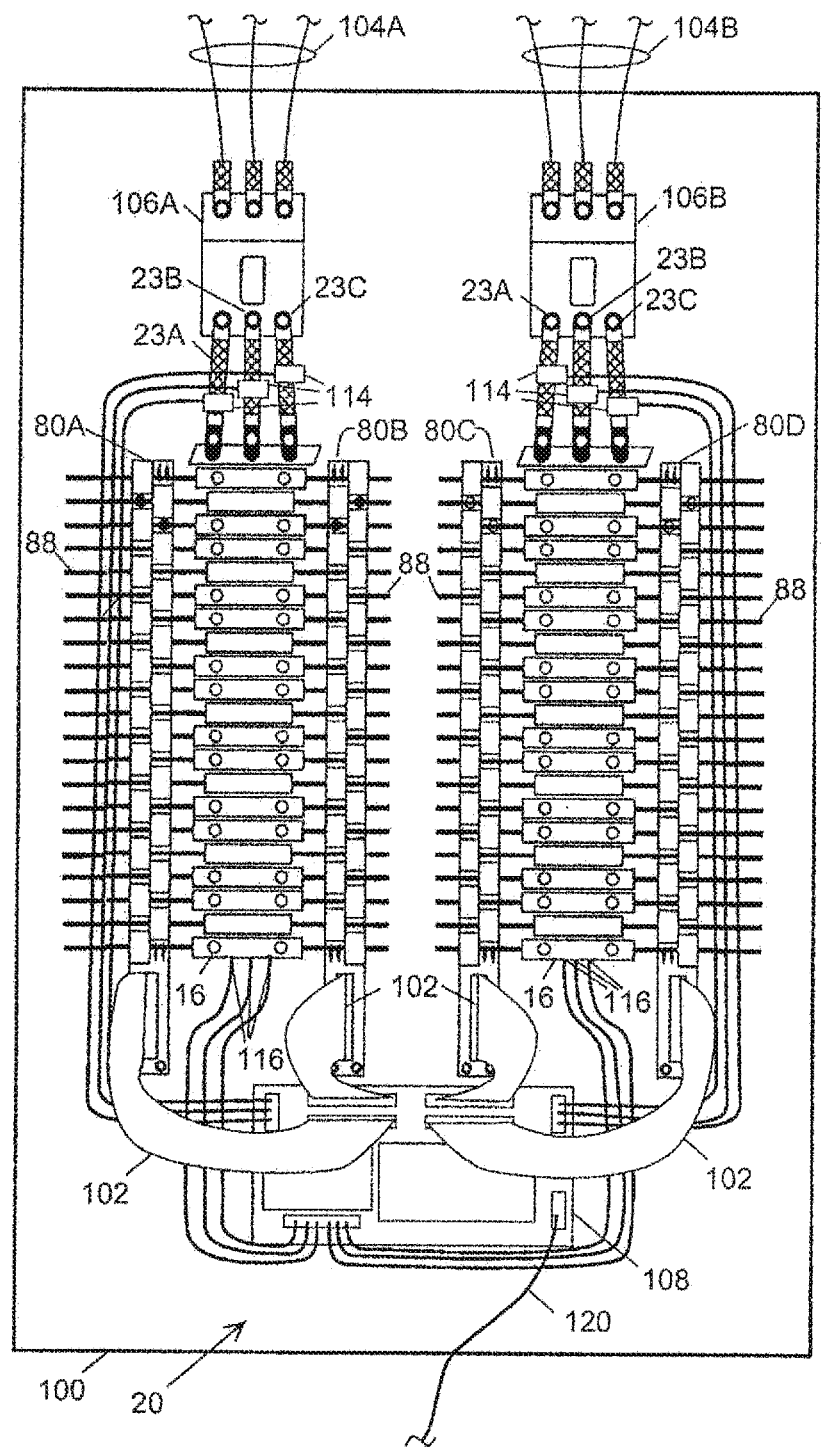
FIG. 4 is a front view of an exemplary electrical distribution panel and branch current monitor.

Referring also to FIGS. 2, 3, and 4, monitoring current in a plurality of branch circuits requires a plurality of current transducers, each one encircling one of the branch power cable(s) 88 that connect the power distribution panel to the load(s) of the respective branch circuit. Current sensing may be performed by an individual current sensor, such as the current transformer 54D, which is connected to the current module. On the other hand, a branch current monitor may comprise one or more sensor strips 80 each comprising a plurality of current sensors attached to a common support, such as sensors 54A, 54B, 54C. The sensors 54 are preferably current transformers but other types of sensors may be used, inclusive of split-core transformers. Each current transformer comprises a coil of wire wound on the cross-section of a toroidal metallic or non-metallic core. The toroidal core is typically enclosed in a plastic housing that includes an aperture 82 enabling the power cable 88 to be extended through the central aperture of the core. The openings 82 defined by the toroidal cores of the transformers are preferably oriented substantially parallel to each other and oriented substantially perpendicular to the longitudinal axis 90 of the support 86. To provide a more compact arrangement of sensors, the sensors 54 may be arranged in substantially parallel rows on the support and the housings of the sensors in adjacent rows may be arranged to partially overlap in the direction of the longitudinal axis of the support. To facilitate routing the power cables of the branch circuits through the cores of the current transformers, the common support maintains the current transformers in a fixed spatial relationship that preferably aligns the apertures of the toroidal coils directly opposite the connections of the power cables 88 and their respective circuit breakers 16 when the strip is installed in a distribution panel 100. For protection from electrical shock, a transient voltage suppressor 94 may be connected in parallel across the output terminals of each sensor to limit the voltage build up at the terminals when the terminals are open circuited.

The transducer strip 80 may include the current sensor memory 56 containing characterization data for the current transformers mounted on the support 86. The current sensor memory may also include characterization data for the transducer strip enabling the data processing unit to determine whether a transducer strip is compatible with the remainder of the meter and whether the strip is properly connected to the data processing module. Improper connection or installation of an incompatible transducer strip may cause illumination of signaling lights or a warning message on the meter's display. In addition the transducer strip 80 may comprise a current module of the power meter with one or more current transformers 54, the multiplexer 52, the current sampling unit 50 and the current sensor memory all mounted on the support 86. A connector 98 provides a terminus for a communication link 102 connecting the current transducer strip (current module) to the data processing module 22.

The branch current monitor may also include one or more errant current alarms to signal an operator or data processing system that manages the facility or one or more of its operations of an errant current flow in one of the monitored branch circuits. When a current having a magnitude greater or lesser than a respective alarm current limit is detected in one of the branch circuits an alarm annunciator is activated to notify the operator or another data processing system of the errant current flow. An alarm condition may be announced in one or more ways, including, without limitation, periodic or steady illumination of a light 71, sounding of an audible alarm 73, display of a message on the meter's display 32 or transmission of a signal from the communications interface 34 to a remote computer or operator.

A commercial power distribution panel commonly supplies a substantial number of branch circuits and a branch current monitor for a distribution panel typically includes at least an equal number of current transformers. Referring to FIG. 4, an exemplary electrical distribution panel includes two three-phase mains 104A, 104B which respectively are connected to main circuit breakers 106A, 106B. Each of the phases of each main is connected to a bus bar 23A, 23B, 23C. The three bus bars extend behind each of two rows of branch circuit breakers 16 that respectively conductively connect one of the bus bars to a conductor 54 that conducts current to the branch circuit's load(s). A single phase load is connected to single bus bar, a two-phase load is typically connected to two adjacent circuit breakers which are connected to respective bus bars and a three-phase load is typically connected to three adjacent circuit breakers which are each connected to one of the three bus bars. Typically, a two-phase load or three phase load is connected to the appropriate number of adjacent circuit breakers in the same row. The exemplary distribution panel has connections for 84 branch circuit conductors which can be monitored by a branch current monitor produced by Veris Industries, Inc. The branch current monitor monitors the current, voltage and energy consumption of each circuit of the distribution panel, including the mains. The accumulated information can be transmitted to a remote consumer through a communications interface or viewed locally on a local display. Data updates occur approximately every two seconds and as a circuit approaches user configured thresholds, alarms are triggered by the monitor.

As illustrated in FIG. 4, the main acquisition circuit board 108 of the branch current monitor 20 is connectable to as many as four current transformer strips or support units 80A, 80B, 80C, 80D each supporting 21 current transformers. The transformers of the support units are connectable to the data processing unit of the branch current monitor by communication links 102 comprising multi-conductor cables. In addition, the branch current monitor includes connections for six auxiliary current transformers 114 which are typically used to monitor the current in the mains. Since the voltage and phase are common for all loads connected to a bus bar, the branch current monitor also includes six voltage connections 116. A data channel 120 connected to the communications interface enables transmission of data captured by the branch current monitor to other data processing devices that are part of a building management system or other network. The main acquisition circuit board 108 is preferably housed in a housing. In some embodiments, the main acquisition circuit board 108 includes one or more connectors suitable to detachably connect a separate power meter to sense electrical properties of the current and/or voltage being sensed. The strips or support units may be housed in a housing, in whole or in part. In some embodiments, the strips or support units includes one or more connectors suitable to detachably connect a separate power meter to sense electrical properties of the current and/or voltage being sensed.

The branch current monitor is installed in the distribution panel by mounting the current transformer strips to the panel adjacent to the rows of circuit breakers and by passing each of the branch circuit conductors 88 through a central aperture in one of the toroidal current transformers and connecting the conductors to the respective circuit breakers. The main acquisition board 108 is attached to the electrical panel and the multi-conductor cables 102 are connected to the board. The main acquisition board 108 is preferably housed in a housing. The mains conductors are passed through the apertures in the auxiliary current transformers and the auxiliary current transformers are connected to the main acquisition board. The voltage taps are connected to respective bus bars and to the main acquisition board. The data channel 120 is connected and the branch current monitor is ready for configuration.

Figure 5:
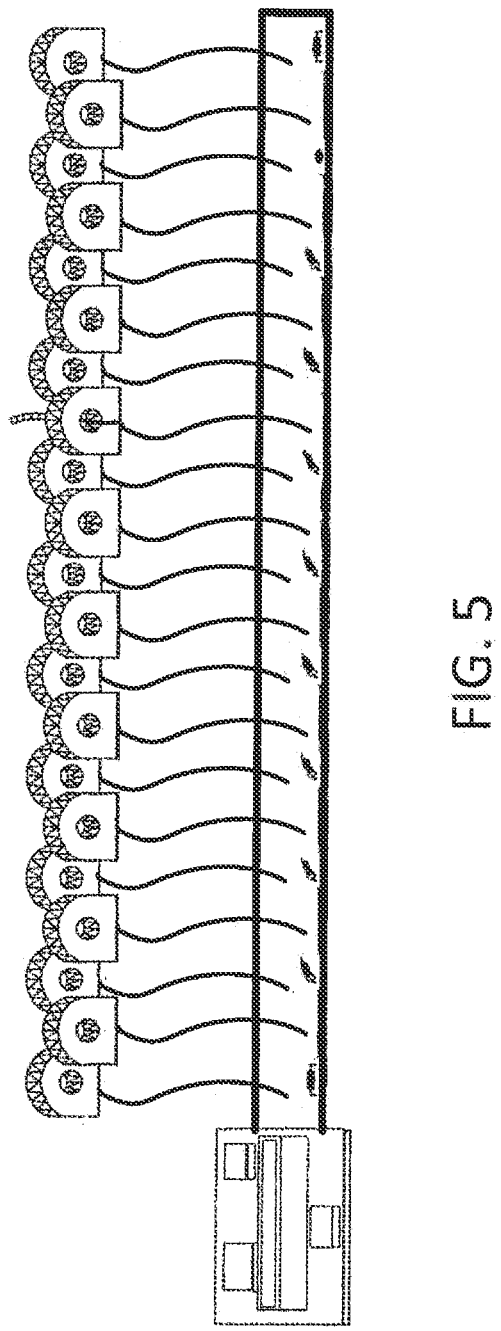
FIG. 5 illustrates a perspective view of another current transformer strip for a branch current monitor.

Referring to FIG. 5, in another embodiment, the strip unit may include a set of connectors at each general location a current sensor is desired. A current transformer may be included with a flexible wire within a connector at the end thereof and a connector on the strip unit. The current transformer is then detachably connectable to the connector of the strip unit. The current transformer may include a solid core or a split core, which is more readily interconnected to existing installed wires. If desired, the strip unit may include one or more power calculation circuits supported thereon. For example, the data from the current transformers may be provided to the one or more power calculation circuits supported thereon together with the sensed voltage being provided by a connector from a separate voltage sensor or otherwise voltage sensed by wires interconnected to the strip unit or signal provided thereto. As a result of this configuration, the connector may provide voltage, current, power, and other parameters to the circuit board. All or a portion of the strip unit is preferably housed in a housing. The strips unit may be housed in a housing, in whole or in part. In some embodiments, the strip unit includes one or more connectors suitable to detachably connect a separate power meter to sense electrical properties of the strip unit.

Figure 6:
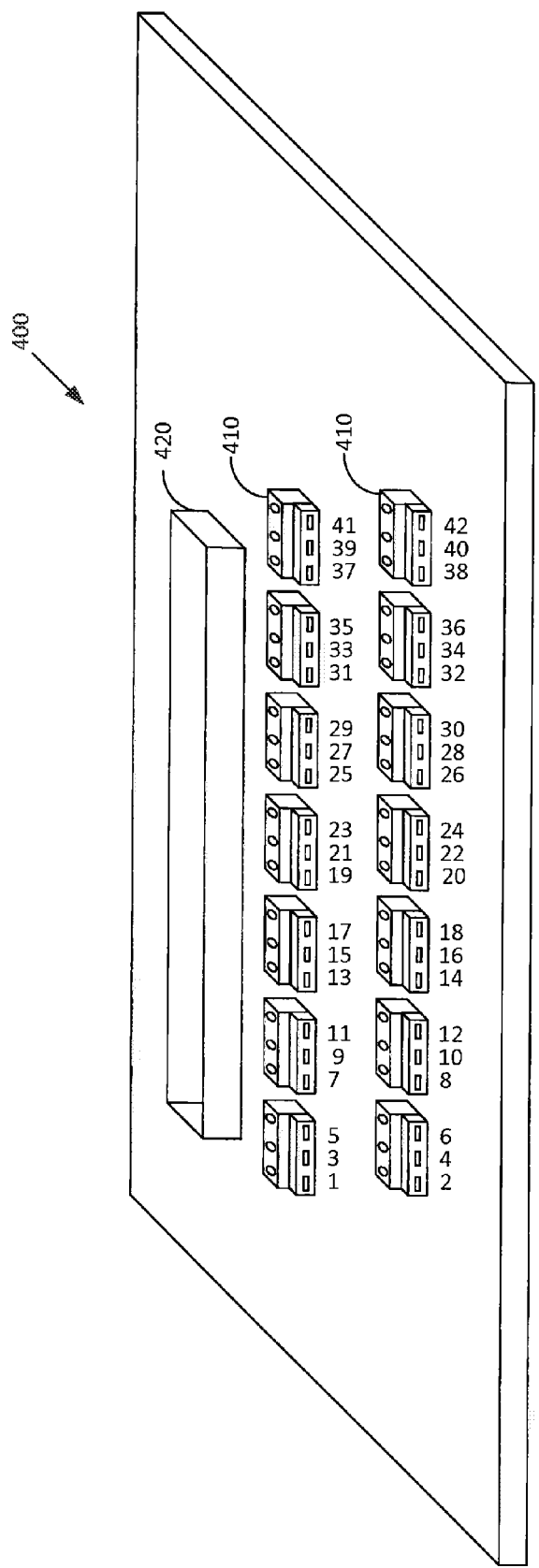
FIG. 6 illustrates a view of a connector board for a branch current monitor.

Referring to FIG. 6, another embodiment includes a set of one or more connector boards 400 in addition to or as an alternative to the strip units. Each of the connector boards may include a set of connectors 410 that may be used to interconnect a current transformer thereto. Each of the connector boards may include a connector 420 that interconnects the connector board to the circuit board 108. Each of the connector boards may be labeled with numbering, such as 1 through 14 or 1 through 42, and 15 through 28 or 42 through 84. Often groups of three connectors are grouped together as a three phase circuit, thus connectors 1 through 42 may be 14 three phase circuits. For example, the connector board with the number of 1 through 14 may be intended to be connected to connector A. For example, the connector board with the numbers of 15 through 28 may be intended to be connected to connector B. All or a portion of the connector board is preferably housed in a housing. In some embodiments, the connector board includes one or more connectors suitable to detachably connect a separate power meter to sense electrical properties of the connector board.

Figure 7:
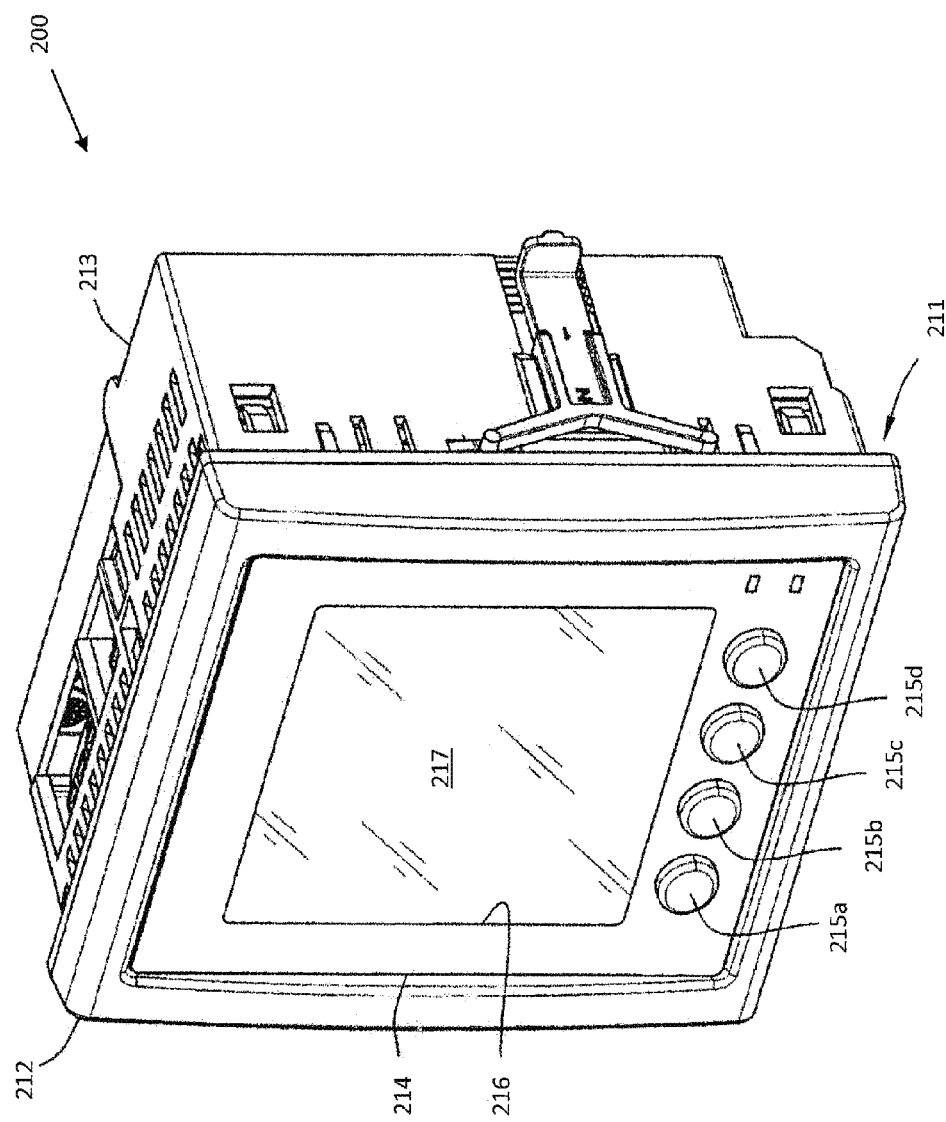
FIG. 7 illustrates an exemplary embodiment of a power meter.
Figure 8:
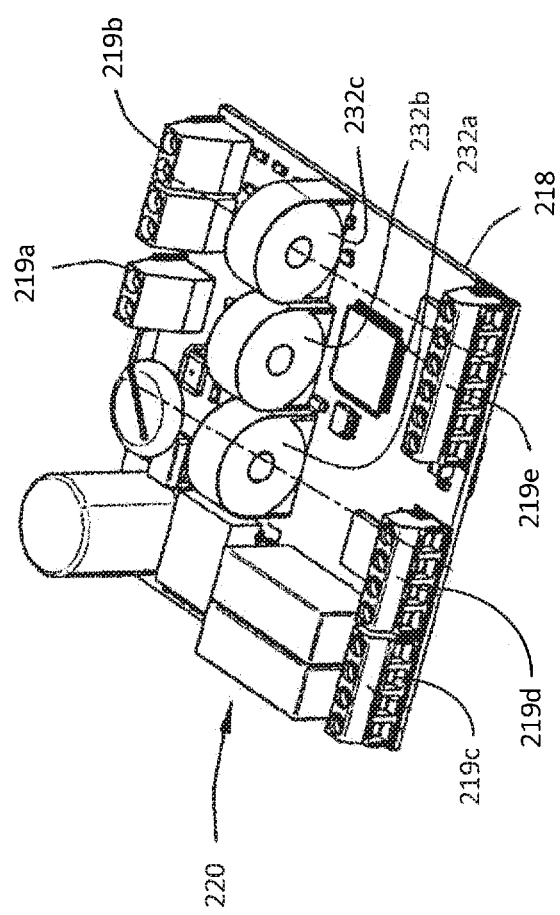
FIG. 8 illustrates a circuit board included within the power meter of FIG. 7.

Referring to FIG. 7, another embodiment of a power meter 200 is housed in a housing 211 formed by a front bezel 212 and a back cover 213 that snap together. The front bezel 212 may be bonded to a user-interface panel 214 that contains four manually operable pushbuttons 215a-215d and a central window 216 for viewing a display 217, such as an LCD, attached to the bezel 212. Behind the display 217 is a printed circuit board 218 (see FIG. 8) that has multiple terminal blocks 219a-219e and associated circuitry 220 mounted on one or both sides of the board 218. The terminal blocks 219a and 219b are used to connect the circuitry 220 to a control power supply and voltage input lines, respectively. For example, the voltage lines may be from the power panel or from the wire to the load(s). In addition the same voltage lines, for example from the power panel or the wire to the load, may further be extended to pass through a respective current transformer to sense the current therein. Also, a respective current sensor of a set of one or more current transformers may encircle a respective wire to a load, where the wires from the respective current transformer being interconnected to suitable terminals of one or more of the terminal blocks. In this manner, the power meter is capable of sensing or otherwise receiving signals representative of the voltage and current in the wires to the load(s). Terminal block 219c may be used to connect digital outputs of the circuitry 220, such as demand sync signals, alarm signals or external control signals, to relays, motors, meters or other devices. Terminal block 129d may be an RS485 port used for communicating with a monitoring and control system and can be daisy chained to multiple devices. Terminal block 219e may be used to receive digital inputs for determining circuit breaker status, counting pulses, counting motor starts, accepting demand sync pulses, and/or input metering. The terminal blocks 219a-219e and the circuitry 220 (simplified for purposes of illustration) may be used to monitor either a single-phase, a two-phase, and/or a three-phase electrical power distribution system. Typically the meter is used to measure currents and voltages and report in real time their root-mean-square values, which includes values for all three phases and neutral in the case of a three-phase power distribution system. The meter also typically calculates power factor, real power, reactive power and other electrical parameters. In some embodiments, the housing 211 includes one or more connectors suitable to detachably connect a separate power meter to sense electrical properties of the current and/or voltage being sensed.

Figure 9:
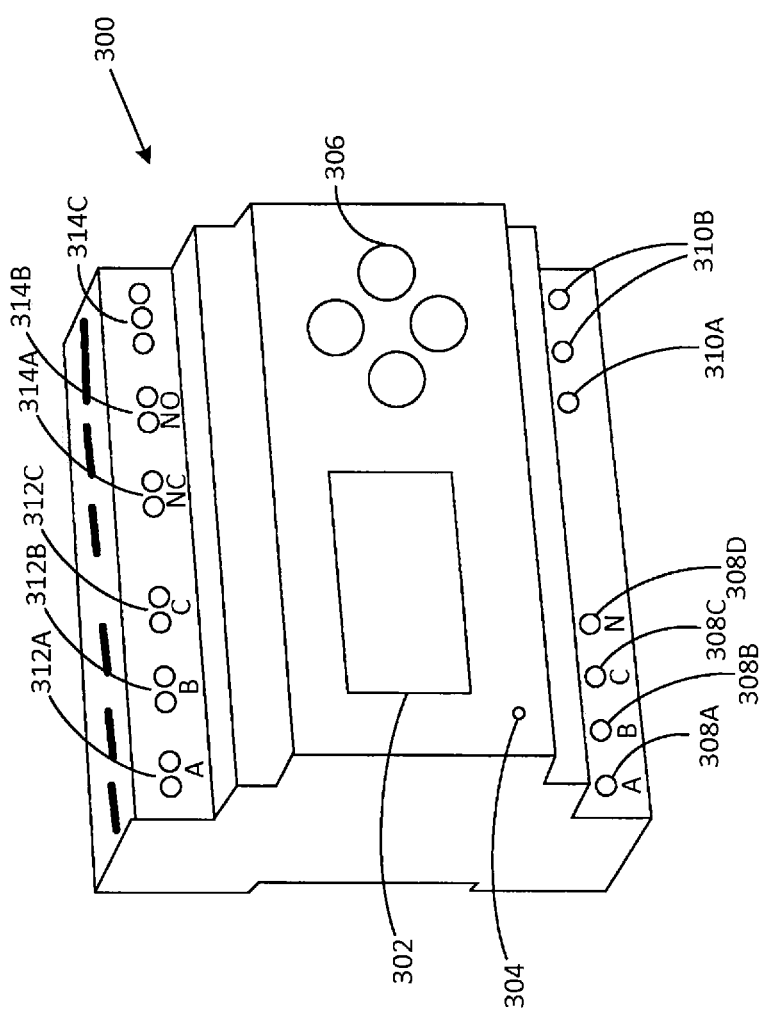
FIG. 9 illustrates another exemplary embodiment of a power meter.

Referring to FIG. 9, another embodiment of a power meter 300 housed within a housing suitable to be mounted to a standard 35 mm DIN rail or screw-mounted to the interior surface of an enclosure. The power meter 300 may include an alphanumeric display 302 to display information, such as power usage and the type thereof. The power meter 300 may include an alarm light 304 when an alarm condition occurs. The power meter 300 may include a set of configuration buttons 306. The power meter may include a set of voltage inputs, such as voltage A 308A, voltage B 308B, voltage C 308C, and voltage neutral 308D. The power meter 300 may also include an earth ground 310A and control power 310B. The power meter 300 may sense the current by using current transformers that are respectively interconnected to current sensor input phase A 312A, current sensor input phase B 312B, and/or current sensor input phase C 312C. The power meter 300 may have a set of outputs, such as a normally closed phase loss alarm 314A, a normally open pulse output representative of energy usage 314B, and other outputs 314C. In some embodiments, the power meter 300 includes one or more connectors suitable to detachably connect a separate power meter to sense electrical properties of the current and/or voltage being sensed.

Figure 10:
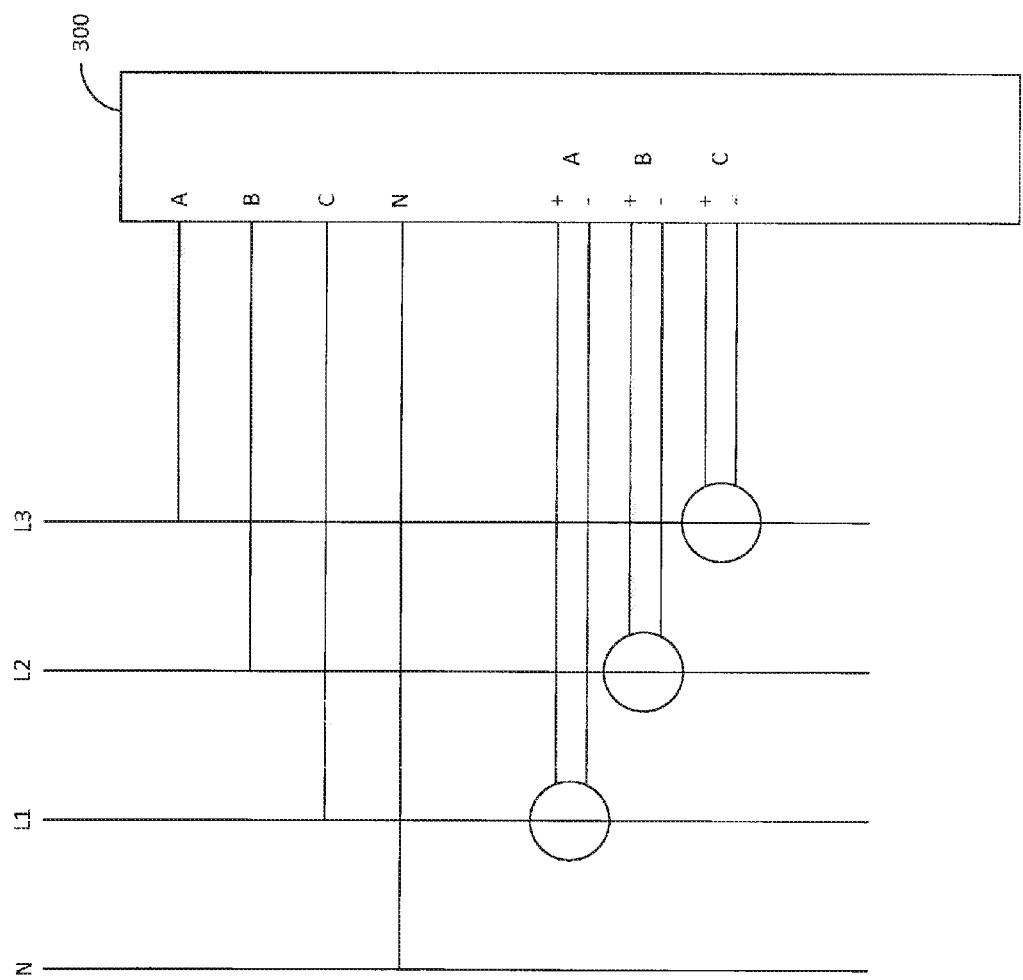
FIG. 10 illustrates one manner of wiring a power meter for sensing voltage and current.

Referring to FIG. 10, an exemplary wiring diagram for a 3-phase 3-wire current transformer with a neural is illustrated. By way of example, the power meter may determine one or more of the following electrical parameters for one or more phases of the input, such as real energy, total instantaneous real power, total instantaneous reactive power, total instantaneous apparent power, total power factor, voltage L-L, voltage average, voltage L-N, current, real power, power factor, voltage phases A-B/B-C/A-C/A-N/B-N/C-N, instantaneous current, frequency, apparent energy consumption, reactive energy consumption, apparent power, reactive power, total real power, total reactive power, total apparent power, etc.

In some embodiments, the power meter may be electrically connected in series with the loads, if desired. As illustrated in FIG. 1 through FIG. 10, the power meter may be in many different configurations and form factors. All or portions of the power meter is preferably housed in a housing. Whether housed in a housing or not housed in a housing, all or portions of the power meter preferably include one or more connectors suitable to detachably connect a separate power meter to sense electrical properties of the power meter, such as the voltage and/or current so that the additional power meter may determine power measurements.

Figure 11:
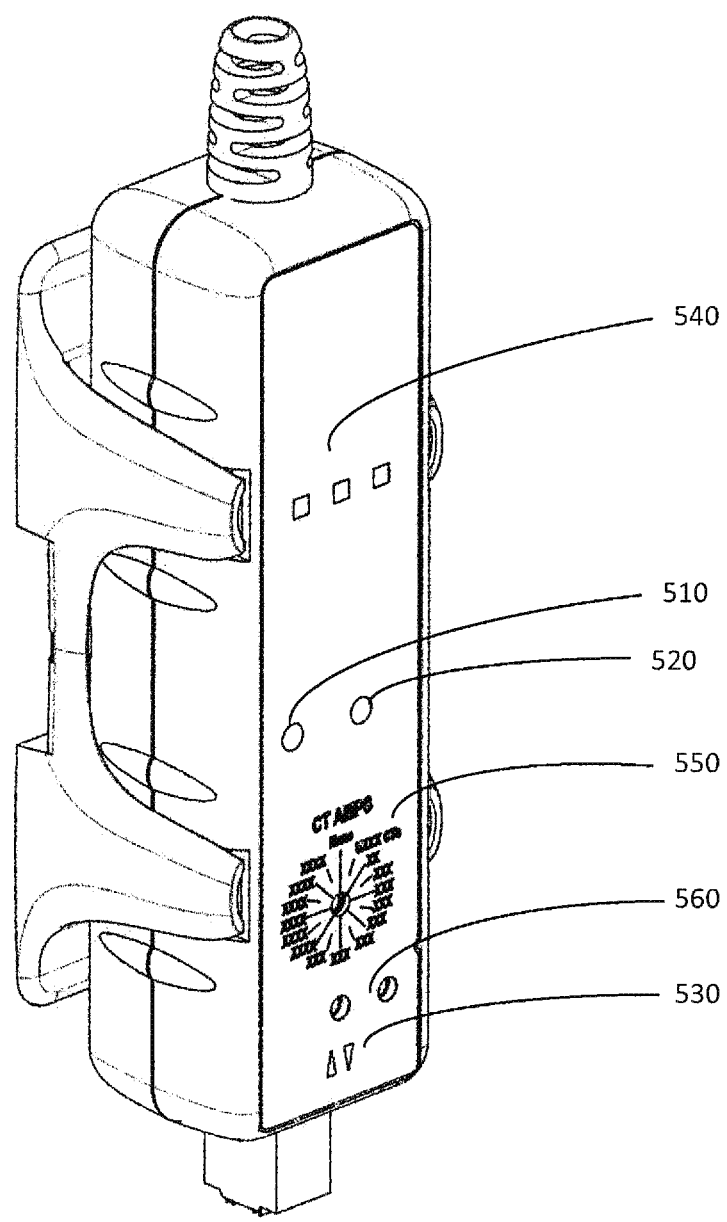
FIG. 11 illustrates another exemplary embodiment of a power meter.
Figure 12:
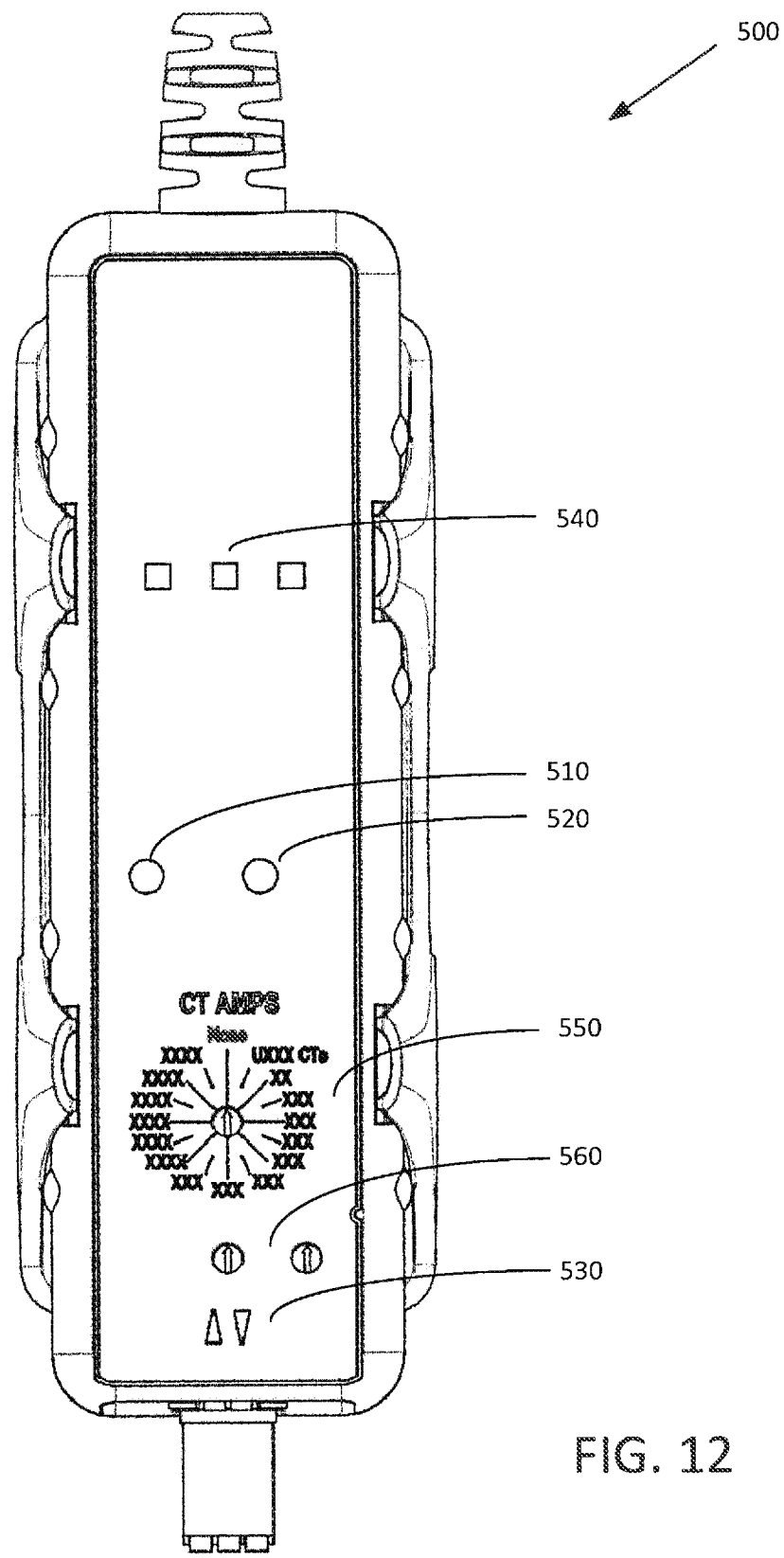
FIG. 12 illustrates another exemplary embodiment of a power meter.

Referring to FIG. 11 and FIG. 12, another embodiment of a power meter 500 is illustrated. The power meter 500 may include a meter status 510, which may be a multi-colored light emitting diode. A green output for the meter status 510 may indicate normal operation. A red output for the meter status 510 may indicate an error condition. An alternating red and green output for the meter status 510 may indicate a firmware download mode to the power meter 500. The power meter 500 may include a settings override 520, which may be a light emitting diode. An off light for the settings override 520 may indicate the meter is operating normally with the parameters as set on the front panel of the power meter 500. An on light for the settings override 520 may indicate that one or more of the user interface controls (e.g., rotary dials) on the meter has been overridden through the communications. In this manner, the user may be readily aware that the rotary dials on the front of the meter are no longer necessarily accurate. The power meter 500 may include a communications status 530, which may be a multi-colored light emitting diode and a pair of indicators. One of the indicators may be an upwardly facing triangle and the other indicator may be a downwardly facing triangle. A yellow output of the upwardly facing triangle may indicate that the meter is in an auto-baud mode and has not yet locked onto a baud rate, parity, and protocol (described layer). A red output of the upwardly facing triangle may indicate that the meter has received a communication error, such as a bad CRC or framing error (described later). A green output of the upwardly facing triangle may indicate that the meter has received a valid frame. A green output of the downwardly facing error may indicate that the meter is transmitting. The power meter 500 may include a phase status 540, which may be multi-colored light emitting diodes. The number of blinks between pauses indicated the power factor in tenths. For example, a blink count of 7 would be a power factor of approximately 0.70 (in the range of 0.65 and 0.75). The phase status 540 may include a set of three light emitting diodes, namely a first one for line 1 (left side), a second one for line 2 (middle one), and a third one for line 3 (right side). Illumination of one of the light emitting diodes with green indicates a power factor greater than 0.70 for the respective diode. Illumination of one of the light emitting diodes with yellow indicates a power factor less than 0.70 but greater than 0.50 for the respective diode. Illumination of one of the light emitting diodes with a red indicates a power factor less than 0.50 for the respective diode. The phase status 540 may also blink to indicate whether power is being imported (i.e. taken from the grind) by a blink of ¾ of a second, or whether power is being exported (i.e. sent to the grid) by a blink of ¼ of a second). The length of a blink may also indicate that a current transformer has been installed incorrectly. If two phases have a long blink and one phase has a short blink and power is being pulled from the grid, this indicates that a current transformer on the phase with the short blink is likely installed backwards.

The power meter may listen on a RS-485 bus (or other bus) to determine the baud rate, parity, and protocol and then configure itself to match (auto-baud and auto-protocol). This typically takes a dozen packet receptions. When the power meter is listening to determine the baud rate and protocol, the Rx LED will flash yellow. If the power meter is power-cycled when the meter has been communicating in Modbus TRU mode, it will remember the baud rate, parity, and Modbus protocol when power is restored. If the power meter is power-cycled when communicating in BACnet MS/TP mode, it will come up in listen mode. If the power meter sees numerous CRC or framing errors, such as three, it will return to the listening mode (Rx LED flashing yellow).

The power meter 500 may include a CT amperage rotary switch 550. The amperage rotary switch 550 may be used to select the rating (in amps) of ⅓ volt current transformers, or otherwise, attached to the power meter 500. If the correct size is not on the list, then the next higher value, or a precise value may be configured over the communication port. The power meter 500 may also include address rotary switches 560. The address rotary switches 560 configures the meter to an address in the rage of 1 to 99 for Modbus or 0 to 99 for BACnet (MAC) that is unique on the bus. The left rotary is the most significant digit, and the right is the least significant bit.

Figure 13:
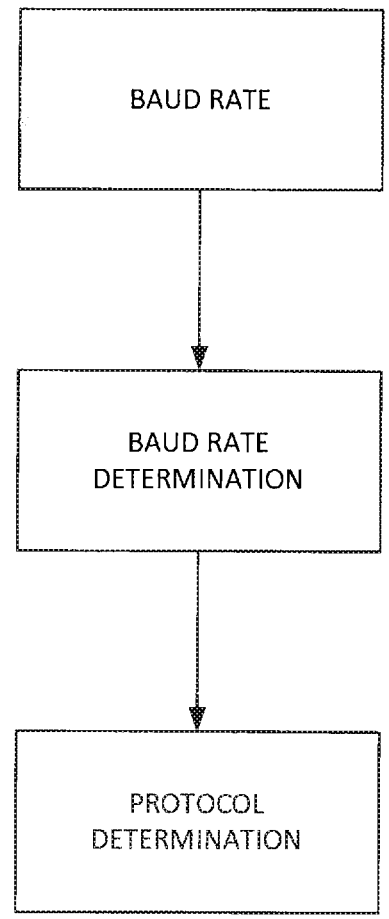
FIG. 13 illustrates a baud rate and protocol determination.

Referring to FIG. 13, the baud rate of the data packets on the network may be, for example, 300, 1200, 2400, 4800, 9600, and 19200 baud. The baud rate refers to the frequency of bit presentation, for the transmitting device, and to the frequency of bit sampling, for the power meter, both expressed in hertz (Hz). If the power meter operates at any baud rate other than the baud rate used by the transmitting device, the information collected is invalid. To increase the likelihood that valid information is collected, the system may initially determine the baud rate used by the transmitting device. Once the baud rate is determined, then the subsequent data that is received by the power meter may be received at the determined baud rate. In this manner, the data that is received by the power meter may be subsequently identified.

After the power meter determines the baud rate, the power meter may then identify the type of protocol that is being used for the communication, such as Modbus, BACnet, etc. together with its polarity. To determine the type of protocol that is being used, the power meter preferably reads the cyclic redundancy bits, and determine which type of protocol for the data packets that the cyclic redundancy bits correspond to. Other determination techniques may likewise be used, as desired. For example, the cyclic redundancy bits may correspond to a Modbus protocol for the particular data packet. For example, the cyclic redundancy bits may correspond to a BACnet protocol for the particular data packet. The cyclic redundancy bit may be checked for a plurality of data packets until the power meter 500 has sufficient confidence that the protocol has been determined, such as 1 to 12 data packets. The power meter may receive and process data packets based upon the baud rate determination and the protocol determination. In the event that the power meter is unable to effectively process the data packets, the system may resume the determination of the baud rate determination and/or the protocol determination. In this manner, the power meter may be adaptive to changing protocols on the network.

A Modbus controller, a BACnet controller, or other controller may provide the data packets to the network using a selected protocol and selected baud rate. In addition, the controller may provide packets to the network using more than one selected protocols at a selected baud rate. In addition, the controller may provide packets to the network using one selected protocol at more than one baud rate. In addition, the controller may provide packets to the network using more than one selected protocols and more than one baud rate. Moreover, the controller may provide packets to the network with the address of a particular power meter (or otherwise a device) with a selected baud rate and a selected protocol, while also providing packets to the network with a different address for a different particular power meter (or otherwise a device) with a selected baud rate and a selected protocol that is different than the particular power meter. In this manner, the controller may direct packets to particular devices in a manner suitable for the particular devices.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

The invention claimed is:
1. A power meter comprising:
(a) said power meter including an enclosure having an exterior;
(b) said power meter including a meter status observable from said exterior of said enclosure;
(c) said power meter including a settings status observable from said exterior of said enclosure;

(d) said power meter including a communications status observable from said exterior of said enclosure;

(e) said power meter including a phase status observable from said exterior of said enclosure;

(f) said power meter including a non-binary phase status observable from said exterior of said enclosure;

(g) said power meter including an input device that receives data in the form of data packets related to electrical characteristics of a least one load, where a data processor of said power meter determines (1) a baud rate based upon the frequency of data sampling by said power meter of said data packets among a plurality of predetermined baud rates, (2) a parity based upon bits of data sampling by said power meter of said data packets among a plurality of parities, and (3) a protocol based on cyclic redundancy bits of data sampling by said power meter of said data packets among a plurality of protocols of said received data.

2. The power meter of claim 1 wherein said meter status is a multi-colored light emitting device.

3. The power meter of claim 2 wherein an output color of green for said multi-colored light emitting device indicates normal operation.

4. The power meter of claim 2 wherein an output color of red for said multi-colored light emitting device indicates an error condition.

5. The power meter of claim 2 wherein an alternating red and green output for said multi-colored light emitting device indicates a firmware download.

6. The power meter of claim 1 wherein an on state of said settings status indicates that one of a user interface controls has been overridden through another setting.

7. The power meter of claim 1 wherein said communications status includes an indicator indicating an auto-baud mode which has not yet locked onto a baud rate, a parity, and a protocol.

8. The power meter of claim 7 wherein said communications status indicates a communication error.

9. The power meter of claim 8 wherein said communications status includes a framing error.

10. The power meter of claim 1 wherein said non-binary phase status including a light emitting device.

11. The power meter of claim 10 wherein said light emitting device for said non-binary phase status blinks indicating a phase angle.

12. The power meter of claim 11 wherein said light emitting device for said non-binary phase status blinks includes a plurality of lights.

13. The power meter of claim 12 wherein each of said plurality of lights relates to a different phase for said power meter.

14. The power meter of claim 12 wherein said baud rate, said parity, and said protocol are initialized to a previous such state.

15. The power meter of claim 12 wherein said baud rate, said parity, and said protocol are reacquired if such initialization results in a sufficient number of errors.

16. The power meter of claim 1 wherein said power meter first determines said baud rate, then after said power meter determines said baud rate said power meter determines said protocol.

17. The power meter of claim 16 wherein said power meter determines said protocol based upon cyclic redundancy bits.

18. A power meter comprising:

(a) said power meter including an enclosure having an exterior;

(b) said power meter including an input device that receives data in the form of data packets related to electrical characteristics of a least one load, where a data processor of said power meter determines (1) a baud rate based upon the frequency of data sampling by said power meter of said data packets among a plurality of predetermined baud rates, (2) a parity based upon bits of data sampling by said power meter of said data packets among a plurality of parities, and (3) a protocol based on cyclic redundancy bits of data sampling by said power meter of said data packets among a plurality of protocols of said received data.

19. The power meter of claim 18 further comprising a communications status observable from said exterior of said enclosure that includes an indicator indicating an auto-baud mode which has not yet locked onto a baud rate, a parity, and a protocol.

20. The power meter of claim 18 wherein said power meter first determines said baud rate, then after said power meter determines said baud rate said power meter determines said protocol.

\* \* \* \* \*